United States Patent [19]

Winebarger et al.

[11] Patent Number: 5,478,436
[45] Date of Patent: Dec. 26, 1995

[54] SELECTIVE CLEANING PROCESS FOR FABRICATING A SEMICONDUCTOR DEVICE

[75] Inventors: Paul M. Winebarger; Mark A. Zaleski; Troy B. Morrison, all of Austin; Jeffrey J. Sultemeier, Buda, all of Tex.

[73] Assignee: Motorola, Inc., Schaumburg, Ill.

[21] Appl. No.: 364,142

[22] Filed: Dec. 27, 1994

[51] Int. Cl.$^6$ ........................................................ H01L 21/00
[52] U.S. Cl. ........................ 156/636.1; 134/3; 156/645.1; 156/656.1; 216/38; 216/52; 216/88; 252/79.3; 252/79.4
[58] Field of Search ............................ 156/636.1, 637.1, 156/645.1, 656.1, 657.1, 662.1; 216/38, 52, 88, 90; 252/79.1, 79.3, 79.4; 134/2, 3, 22.19

[56] References Cited

U.S. PATENT DOCUMENTS 5,112,437   5/1992   Watanabe et al. .................. 252/79.4 X

OTHER PUBLICATIONS

D. S. Herman et al., "Multilayer Metallization Processes for CMOS FET Devices", The Electrochemical Society, May 9–13, 1971, pp. 166–169.
Advanced Chemical Systems International, Inc. (ACSI), Technical Document 005.1, Date Unknown, pp. 1–14.
Advanced Chemical Systems International, Inc. (ACSI), Data Sheet 021.2, Noe Etch, Date Unknown, p. 2.

Primary Examiner—William Powell
Attorney, Agent, or Firm—Jasper W. Dockrey

[57] ABSTRACT

A selective cleaning process for fabricating a semiconductor device includes the steps of processing a semiconductor substrate (10) and introducing metal contaminants (22) by contacting the semiconductor substrate (10) with a polishing slurry during a polished planarization process. The metal contaminants (22) are removed by applying a cleaning solution including an organic solvent and a compound containing fluorine. The chemical constituents of the cleaning solution are substantially unreactive with metal interconnect material (12) underlying dielectric layers (18) present on the semiconductor substrate (10). The preferred cleaning solution comprises an aqueous solution of ethylene glycol and ammonium fluoride.

17 Claims, 1 Drawing Sheet

SELECTIVE CLEANING PROCESS FOR FABRICATING A SEMICONDUCTOR DEVICE

FIELD OF THE INVENTION

This invention relates, in general, to a method for fabricating a semiconductor device, and more particularly, to a method for cleaning metal contaminants from the surface of a multi-layer metal device.

BACKGROUND OF THE INVENTION

In order to build faster and more complex integrated circuits, semiconductor manufacturers have increased the number of components in the integrated circuit, while reducing the overall size of the circuit. The small circuit dimensions require multiple metal interconnect layers to electrically couple the vast number of components within the integrated circuit. As successive layers of metal and dielectric materials are deposited, the surface topography can become uneven. To be manufactured reliably, metal interconnect patterns must be defined on a smooth, planar surface. Some type of planarization process is necessary to even out the surface during the formation of multiple layers of metal interconnects.

A planarization process is typically performed after the deposition of a dielectric passivation layer to reduce the topographic contrast of the passivation layer. A conductive metal layer is then deposited on the smooth surface, and an interconnect pattern is defined thereon. A planar surface can be formed during device fabrication by a variety of methods. In one technique, a deposition and etchback process can be used in which a planarization layer is deposited over the surface to be planarized, followed by a non-selective plasma etching process. The plasma etching process removes both the planarization material and the underlying dielectric material at approximately the same rate.

Additionally, polishing planarization processes have been developed which abrasively remove material from the surface of the substrate. The polishing process is known in the art as chemical-mechanical-polishing (CMP). In the CMP process, the surface to be planarized is brought into contact with a rotating polishing pad in the presence of an abrasive slurry. A portion of the surface layer is then abrasively removed by the mechanical action of the polish pad and the chemical action of the slurry.

Although both the etchback process and the CMP process are effective in forming a planar surface, both planarization processes leave a particulate residue containing metal contaminants on the substrate surface. In the etchback process, particulate matter and metal contaminants originate from either the planarization material or from metal contaminants introduced during the etching process. The particulate matter can include metals originating from a planarization material, such as photoresist or a spin-on-glass planarization layer. Correspondingly, metal contaminants in the CMP process originate from the chemical constituents of the polishing slurry. The metal contaminants introduced by the planarization process include alkaline metals, such as sodium, potassium, and the like, and iron.

The metal contaminants are typically removed from the substrate surface using a caustic solution containing ammonium hydroxide or ammonium hydroxide mixed with hydrogen peroxide. Additionally, particulate matter has been removed by brush scrubbing with deionized water and ammonium hydroxide. While these processes are effective at removing metal and particulate contaminants, the chemical constituents of the caustic solutions can diffuse through defects in a dielectric layer overlying a metal interconnect. The caustic chemicals are highly reactive with metals, such as aluminum, aluminum alloys, refractory metals, and the like. Once the caustic chemicals reach the surface of an aluminum interconnect, a rapid chemical reaction takes place between the caustic chemicals and the metal interconnect, which in severe cases can result in void formation in a pattern metal interconnect. The formation of voids in a metal interconnect can cause catastrophic device failure. In severe cases, large regions of the metal interconnect can be completely removed by the caustic solution. Accordingly, an improved contaminant cleaning process is necessary to fabricate high reliability semiconductor devices.

SUMMARY OF THE INVENTION

In practicing the present invention there is provided a selective cleaning process for fabricating a semiconductor device in which metal contaminants are removed from the surface of a semiconductor substrate, while preserving the integrity of underlying metal interconnect structures. Following the processing of a semiconductor substrate which introduces metal contaminants onto the surface of the substrate, a cleaning solution is applied to the semiconductor substrate to remove the metal contaminants. The cleaning solution comprises an organic solvent and a compound containing fluorine. The chemical constituents of the cleaning solution are effective in the removal of metal contaminants from the surface of the semiconductor substrate, yet are substantially unreactive with metal interconnect material underlying a dielectric layer.

DETAILED DESCRIPTION OF PREFERRED EMBODIMENTS

The present invention relates to a process for fabricating a semiconductor device in which metal contaminants are removed from the surface of a semiconductor substrate, while preserving the integrity of underlying metal interconnect structures. The chemical constituents of the cleaning solution are selected such that the constituents effectively react with metal contaminants remaining after a planarization process, while being substantially unreactive with metals commonly used to fabricate metal interconnect layers. Examples of metal contaminants include alkaline metals and iron, and the like. Examples of interconnect metals include aluminum, aluminum alloys, refractory metals, refractory metal silicides, aluminum copper alloys, and the like. The fabrication process of the invention is particularly beneficial in a process involving chemical-mechanical-polishing in which a polishing slurry is used to remove a thin-film overlying the surface of a semiconductor substrate.

Although the process of the invention is illustrated in the context of a polish planarization process, those skilled in the art will appreciate that the invention is applicable to any fabrication process requiring the removal of metal contaminants from a substrate containing metallized structures underlying a dielectric material. For example, the process of the invention can be used following an plasma etchback planarization process applied to a multi-level metallized structure.

Figure 1:
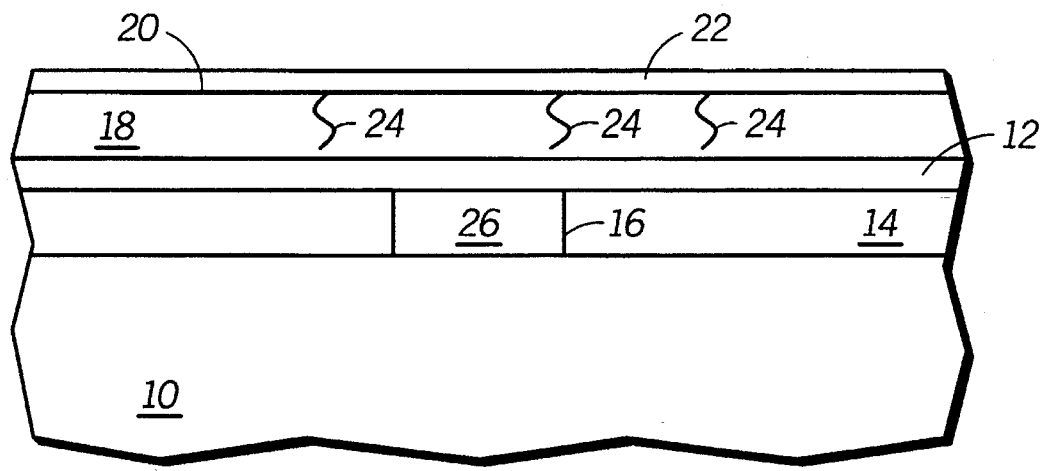
FIG. 1 illustrates, in cross-section, a portion of a semiconductor substrate containing a metallized interconnect structure and interlevel dielectric layers.

Shown in FIG. 1, in cross-section, is a portion of a semiconductor substrate 10 including a representative metallized interconnect structure and inter-level-dielectric (ILD). Specifically, substrate 10 includes a metal interconnect layer 12 overlying a first dielectric layer 14. Metal interconnect layer 12 makes an electrical contact to substrate 10 through an opening 16 in first dielectric layer 14. A second dielectric layer 18 overlies metal interconnect layer 12. Those skilled in the art will recognize that the structure illustrated in FIG. 1 is a generalized metal interconnect structure, which can be a metallized via structure, a substrate contact structure, a portion of a multi-layer metal interconnect structure, and the like.

The structure illustrated in FIG. 1 is shown at a stage in a semiconductor fabrication process immediately following a CMP process in which second dielectric layer 18 is planarized. During the polishing process, the surface of second dielectric layer 18 is contacted by a polishing slurry. Although the particular chemical constituents vary, a polishing slurry useful for the polish planarization of a dielectric material typically includes a colloidal silica suspended in potassium hydroxide (KOH) and water. The polishing operation is carried out in a polishing apparatus having a rotating polish wheel and a polyurethane polishing pad disposed on the polishing wheel. Typical polishing parameters include, a platen temperature of about 38° C., a platen speed of about 50 rpm, and a slurry flow rate of about 175 sccm. Upon application of the polishing slurry together with an abrasive force created by the action of the rotating polishing wheel, a smooth planar surface 20 is formed in second dielectric layer 18.

The polishing process leaves a contaminant layer 22 overlying planar surface 20. Contaminant layer 22 is substantially comprised of alkaline metal constituents of the polishing slurry that have diffused into a surface region of second dielectric layer 18 during the polishing process. Because the alkaline metal contaminants readily diffuse through dielectric materials, these contaminants can diffuse into underlying circuit components and cause electrical failure of the components. It is necessary to remove contaminant layer 22 prior to the continued processing of semiconductor substrate 10 to avoid a degradation in device reliability.

In addition to contaminant diffusion, chemicals used to remove contaminant layer 22 can also diffuse through second dielectric layer 18. The diffusion of contaminants and caustic cleaning chemicals through second dielectric layer 18 is aided by defects 24 in second dielectric layer 18. Defects 24 can be created by internal stress in the deposited dielectric layer, and by mechanical stress induced during the polishing process. Defects 24 provide a diffusion pathway through which chemicals and metal contaminants can readily diffuse.

In accordance with the process of the invention, a cleaning solution is applied to semiconductor substrate 10 for the removal of contaminant layer 22. The chemical constituents are selected such that even if they should diffuse through defects 24, they will not react with the metallurgical components of metal interconnect layer 12. Preferably, the cleaning solution includes an organic solvent and a compound containing fluorine. An important criteria of the organic solvent is that it be a polar solvent that does not activate acids. The fluorinated compound can be an acid, such as hydrogen fluoride, perfluoric acid, and the like, or alternatively, a fluorinated salt, such as ammonium fluoride, and the like.

The organic solvent is preferably a glycol and can be a homologue of an alkyl glycol, such as ethylene glycol, and propylene glycol, and the like. Additionally, the organic solvent can be a non-glycol, such as dimethylsulfoxide. The most preferred cleaning solution comprises a solution containing about 80 weight percent ethylene glycol, about 10 weight percent ammonium fluoride, about 5 weight percent via water, and about 1 weight percent surfactant. The most preferred cleaning solution is available under the tradename "NOE ETCH" from Advanced Chemical Systems International, Inc., Milpitas, Calif. Preferably, the solution is applied to semiconductor substrate 10 while maintaining the temperature of the solution at about 20° to 80° C.

Figure 2:
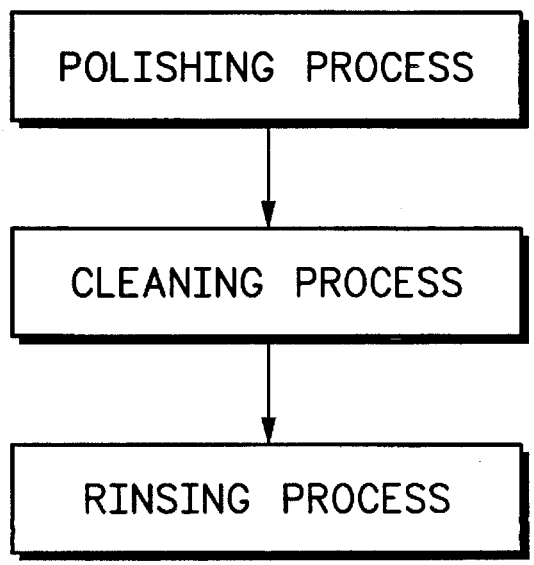
FIG. 2 is a schematic diagram illustrating a process flow in accordance with one embodiment of the invention.

As illustrated in the process flow shown in FIG. 2, one embodiment of the present invention includes a polishing process followed by a cleaning process, and finally a rinsing process. Preferably, the cleaning process is carried out by applying the cleaning solution to the surface of substrate 10 to remove contaminant layer 22. The cleaning solution can be applied by spray application of the cleaning solution to the surface of substrate 10, while spinning substrate 10 to insure dispersion of the cleaning solution uniformly over the surface of substrate 10. Alternatively, substrate 10 can be submerged in a recirculating bath containing the cleaning solution. Preferably, the cleaning process removes about 20 to 200 angstroms of dielectric material, and most preferably about 50 angstroms of dielectric material. Because the cleaning process of the present invention effectively removes substantially all of contaminant layer 22, it is unnecessary to continually hydrate the surface of substrate 10 after completion of the polishing process and prior to initiation of the cleaning process. Accordingly, the present invention overcomes a limitation of the prior art in which substrates must be continually hydrated to avoid introducing a large number of particulate contaminants onto the semiconductor substrate.

After applying the cleaning solution to remove contaminant layer 22, semiconductor substrate 10 is subjected to a rinsing process to remove the chemical elements of the cleaning solution. Preferably, semiconductor substrate 10 is rinsed with ethylene glycol, while maintaining the temperature of the solution at about 20° to 80° C. The glycol rinse removes traces of the fluorinated compound and prevents reaction of the fluorinated compound with water. Finally, the ethylene glycol is removed by rinsing semiconductor substrate 10 with the ionized water.

The cleaning process of the present invention is effective in the removal of potassium and other alkaline metals from the surface of dielectric materials, such as silicon dioxide deposited with tetraethylorthosilane (TEOS) source gas, and doped dielectric materials, such as boro-phosphorus-silicateglass (BPSG), and phosphorus-silicate-glass (PSG), and the like. The cleaning process of the present invention provides an effective cleaning process which does not include an abrasive scrubbing process, nor the application of caustic solutions which can diffuse through defects 24 in second dielectric layer 18 and attack underlying metal interconnect layer 12. It is important to note that the cleaning process of the invention does not present any chemical species capable of reacting with aluminum or other metals, such as refractory metals, and the like. Accordingly, voids in metal interconnect layer 12 are not created by chemical constituents diffusing through defects 24 and the integrity of metal interconnects on a semiconductor substrate is preserved.

The cleaning process of the present invention can also be applied in a semiconductor fabrication process in which a metal layer is planarized. For example, refractory metals are often used to form via plugs in ILD layers. Referring to FIG. 1, a metal plug process includes the formation of a refractory metal plug 26 in opening 16. Typically, refractory metal plug 26 is formed by blanket deposition of a refractory metal, such as tungsten, onto the surface of first dielectric layer 14 and filling opening 16. Then, a polished planarization process is carried out to remove the refractory metal layer and planarize the surface of first dielectric layer 14. The polishing process leaves refractory metal plug 26 in opening 16. Once the surface of first dielectric layer 14 has been planarized, an aluminum deposition patterning process is carried out to form metal interconnect layer 12.

Planarization of a refractory metal layer, such as tungsten, is typically performed by application of a polishing slurry containing iron. Typically, the polishing slurry includes an aqueous solution of iron nitrate and aluminum oxide. The refractory metal polishing process leaves iron metal contaminants on the surface of first dielectric layer 14 in a manner analogous to the formation of contaminant layer 22 on second dielectric layer 18. The iron contaminants must also be removed following the polishing process to avoid degradation of device components (not shown) underlying first dielectric layer 14.

Metal contaminants, such as iron, and the like, can be effectively removed by the cleaning process of the present invention. The process to remove metal contaminants following a refractory metal polishing process is substantially the same as that illustrated in FIG. 2. Following the polishing process, the preferred cleaning solution is applied to semiconductor substrate 10, while maintaining the temperature of the solution at about 20° to 80° C. After a period of time sufficient to remove 20 to 200 angstroms of dielectric material, substrate 10 is rinsed in ethylene glycol, while maintaining the temperature of solution at about 20° to 80° C., followed by rinsing with deionized water.

Thus it is apparent that there has been provided, in accordance with the invention, a selective cleaning process for fabricating a semiconductor device, which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, other types of planarization process are within the scope of the present invention, such as ion milling, and the like. It is therefore intended to include within the invention all such variations and modifications as fall within the scope of the appended claims and equivalents thereof.

We claim:

1. A process for fabricating a semiconductor device comprising the steps of:
    processing a semiconductor substrate and introducing metal contaminants thereon; and
    applying a cleaning solution to the semiconductor substrate to remove the metal contaminants,
    wherein the cleaning solution comprises an organic solvent and a compound containing fluorine.

2. The process of claim 1, wherein the organic solvent is an anhydrous, polar organic compound.

3. The process of claim 2, wherein the organic solvent is selected from the group consisting of glycol and dimethylsulfoxide.

4. The process of claim 3, wherein the glycol is selected from the group consisting of ethylene glycol and propylene glycol.

5. The process of claim 1, wherein the compound containing fluorine is selected from the group consisting of ammonium fluoride, hydrogen fluoride, and perfluoric acid.

6. The process of claim 1, wherein the step of applying a cleaning solution comprises subjecting the semiconductor substrate to the cleaning solution while maintaining the temperature of the cleaning solution between 20° to 80° C.

7. The process of claim 1, wherein the step of exposing a semiconductor substrate to a liquid solution comprises exposing the semiconductor substrate to a polishing slurry.

8. A process for fabricating a semiconductor device comprising the steps of:
    contacting a semiconductor substrate with a polishing slurry;
    applying a cleaning solution to the semiconductor substrate, wherein the cleaning solution comprises an organic solvent and a compound containing fluorine;
    applying a glycol rinse to the semiconductor substrate; and
    applying a water rinse to the semiconductor substrate.

9. The process of claim 8, wherein the cleaning solution comprises glycol and a fluorinated compound selected from the group consisting of ammonium fluoride, hydrogen fluoride, and perfluoric acid.

10. The process of claim 9, wherein the glycol comprises one of either ethylene glycol or propylene glycol.

11. The process of claim 8, wherein the glycol rinse comprises ethylene glycol.

12. A process for fabricating a semiconductor device comprising the steps of:
    subjecting a substrate surface to a polishing slurry containing metal constituents;
    applying a solution containing ethylene glycol and a fluorinated compound to the substrate surface to remove metal contaminants from the substrate surface;
    rinsing the substrate surface with ethylene glycol; and
    rinsing the substrate surface with water.

13. The process of claim 12, wherein the fluorinated compound is selected from the group consisting of ammonium fluoride, hydrogen fluoride, and perfluoric acid.

14. The process of claim 12, wherein the step of applying a solution comprises applying the solution while maintaining the temperature of the solution above about 20° C.

15. A process for fabricating a semiconductor device comprising the steps of:
    providing a semiconductor substrate having a thin-film layer thereon;
    applying a polishing slurry to the semiconductor substrate to remove at least a portion of the thin-film layer;
    applying a cleaning solution containing ethylene glycol and a fluorinated compound to the semiconductor substrate to remove metal contaminants from the semiconductor substrate;
    rinsing the semiconductor substrate with ethylene glycol; and
    rinsing the semiconductor substrate with water.

16. The process of claim 15, wherein the step of applying a cleaning solution to remove metal contaminants comprises removing metal contaminants selected from the group consisting of alkaline metals and iron.

17. The process of claim 15, wherein the step of applying a cleaning solution comprises applying the cleaning solution while maintaining the temperature of the cleaning solution above about 20° C.

* * * * *